(12) United States Patent
Hetzer et al.

(10) Patent No.: US 7,930,845 B2
(45) Date of Patent: Apr. 26, 2011

(54) COVER FOR INSCRIPTION FIELDS

(75) Inventors: Ulrich Hetzer, Berlin (DE); Ferenc Nad, Berlin (DE); Frank Mossner, Berlin (DE)

(73) Assignee: ADC GmbH, Berlin (DE)

( * ) Notice: Subject to any disclaimer, the term of this patent is extended or adjusted under 35 U.S.C. 154(b) by 1115 days.

(21) Appl. No.: 11/318,208

(22) Filed: Dec. 23, 2005

(65) Prior Publication Data

US 2006/0170070 A1 Aug. 3, 2006

(30) Foreign Application Priority Data

Dec. 23, 2004 (DE) .......................... 10 2004 061 973

(51) Int. Cl.
*G09F 3/00* (2006.01)
(52) U.S. Cl. ......................................................... 40/336
(58) Field of Classification Search .................... 40/661, 40/336, 339; 220/4.23, 662; 379/435; D14/142
See application file for complete search history.

(56) References Cited

U.S. PATENT DOCUMENTS

| | | | |
|---|---|---|---|
| 2,587,220 A * | 2/1952 | Ribaudo et al. ................. 281/44 |
| 4,349,975 A | 9/1982 | Chubb | |
| 4,395,591 A | 7/1983 | Kaczkos | |
| 4,467,543 A * | 8/1984 | Townsend ....................... 40/624 |
| 4,616,764 A | 10/1986 | Utoh et al. | |
| 5,331,758 A * | 7/1994 | Romick .......................... 40/661 |
| 7,208,687 B2 | 4/2007 | Hetzer et al. | |
| 2006/0191210 A1 | 8/2006 | Hetzer et al. | |
| 2007/0117428 A1 | 5/2007 | Mössner et al. | |
| 2008/0041854 A1 | 2/2008 | Mössner et al. | |

FOREIGN PATENT DOCUMENTS

| | | |
|---|---|---|
| DE | 1995063 | 6/1968 |
| DE | 7809950 U1 | 4/1978 |
| DE | 41 10 710 | 10/1992 |
| DE | 29513403 U1 | 8/1995 |
| GB | 1386420 | 12/1972 |

* cited by examiner

*Primary Examiner* — Joanne Silbermann
(74) *Attorney, Agent, or Firm* — Merchant & Gould P.C.

(57) ABSTRACT

The invention relates to a cover, in particular for covering inscription fields, comprising a cover element, which is provided for insertion into a base body which is in the form of a holder, with at least one hooking-in element being provided on the cover element, which can be engaged with at least one cutout, which is in the form of a hooking-in opening on the base body, and with at least one latching tab being provided on the cover element and/or on the base body which can engage with at least one cutout which corresponds to the latching tab, and/or is provided on the cover element and is in the form of a latching opening, thus making it possible to form a detachable latching connection between the cover element and the base body, in which case the cover element and/or the base body can be at least partially elastically deformed in a direction running parallel to the surface in the area of the at least one hooking-in element and/or in the area of the at least one latching tab and/or in the area of the at least one cutout which is in the form of a hooking-in opening, so that the cover element and the base body can be locked to one another by latching in a sprung manner.

7 Claims, 5 Drawing Sheets

COVER FOR INSCRIPTION FIELDS

TECHNICAL FIELD

The invention relates to a cover, in particular for inscription fields, as can be used for housings or front panels of electrical appliances or connections.

BACKGROUND

Covers for inscription fields as components of telephone housings are already known and are disclosed, by way of example, in DE411 0710 C1. This relates to a telephone housing with an insert path which can be moved in a replaceable frame, interalia locks the cover plate of an inscription field in the operating position, and releases it when moved in the direction of a rest trough. The inscription field may in this case be fitted in a recessed form, in which case a rear edge of the insert part can be pushed over a locking tab on the upper edge of the cover plate of the inscription field for locking, and the rear edge of the cover plate is mounted such that it can pivot on the telephone housing.

Inscription fields which have to be covered do not just occur in the case of telephone housings, however, but are also being increasingly required for industrial purposes, for example for identification of data lines, electrical cables and connections as well as associated housings or front panels. The requirements in this case are comparatively stringent, in particular with regard to optimum installation capability, flexibility, the capability for versatile use, the capability to be operated easily, robust construction and protection against dust or items being used, which requirements have not yet been adequately satisfied by the known covers for inscription fields.

The optimization of covers, in particular for inscription fields, thus represents a problem which until now has not yet been satisfactorily solved by the normal apparatuses known from the prior art.

SUMMARY

The invention is therefore based on the technical problem of providing an improved cover, in particular for inscription fields.

The invention is in this case based on the discovery that the particularly advantageous arrangement of hooking-in elements and latching tabs on a cover element and on an associated base body in conjunction with the characteristic of elastic deformability in a direction which runs parallel to the surface of the cover makes it possible to produce a robust, functional cover, which can be used in a versatile manner and is simple to handle, for inscription fields of any desired type. According to the invention, this is achieved by proposing a cover element, which is provided for insertion into a base body which is in the form of a holder, with at least one hooking-in element being provided on the cover element, which can be engaged with at least one cutout, which is in the form of a hooking-in opening on the base body, and with at least one latching tab being provided on the cover element and/or on the base body, which can engage with at least one cutout which corresponds to the latching tab, and/or is provided on the cover element and is in the form of a latching opening, thus making it possible to form a detachable latching connection between the cover element and the base body, and in which case the cover element and/or the base body can be at least partially elastically deformed in a direction running parallel to the surface in the area of the at least one hooking-in element and/or in the area of the at least one latching tab and/or in the area of the at least one cutout which is in the form of a hooking-in opening, so that the cover element and the base body can be locked to one another by latching in a sprung manner. The surface is in this case either that outer surface of the cover element which faces away from the base body in the latched-in state or that face which bears against the base body in the latched-in state.

In one advantageous embodiment, the cover element is formed from transparent material. The cover is in this case preferably used for fixing and for protection of a label, composed of paper or film for example, and designed to be adhesive or non-adhesive and on which the information to be conveyed to a user by means of the inscription field is provided. In order to allow the user to see this information at any time and in order that it is available to him without having to do anything else, it is advantageous for the cover element to be transparent, being composed, for example, of a transparent plastic such as acrylic glass.

In a further advantageous embodiment, the cover element can be embedded flush in a base body which has a depression and is in the form of a holder. In this case, a trough whose dimensions and shape correspond to those of the cover element is provided as a holder in the base body, and the cover element can be embedded in this trough in the course of the locking process. After being latched in, that surface of the cover element which faces away from the base body then ends flush with the surrounding flat surface of the base body. In addition to a uniform and straight appearance, this also ensures that there are not projecting corners or edges projecting out of the base body to disadvantageously influence the use of the object to which the cover is fitted.

In a further advantageous embodiment, the cover element can be tilted about the at least one hooking-in element after the latching connection has been released, and can be removed from the base body which is in the form of a holder. The tilting movement to be carried out simplifies handling, in particular during locking and/or unlocking of the cover by the user, and makes it easier to fit. Since the cover element is removable, it can be replaced by a new part without any problems, for example in the event of damage or wear.

In one preferred embodiment, the at least one hooking-in element is at least partially wedge-shaped and can engage with at least one cutout (which corresponds to it and is likewise at least partially wedge-shaped and in the form of a hooking-in opening) on the base body. This embodiment is particularly desirable when it is desirable to have a cover which is robust and less delicate, and which can still be locked and unlocked without any difficulties even in severe external conditions, for example where there is an increased incidence of dust or dirt.

In a further embodiment, the cover element has side slots, which originate from the outer edge of the cover element, in the area of the at least one hooking-in element, so that the area of the cover on which the at least one hooking-in element is located can be moved elastically and flexibly transversely with respect to the slot direction. This embodiment also offers the capability for a particularly robust configuration, since the elastic flexibility can nevertheless be ensured by appropriate positioning of the side slots, even if the walls are relatively thick, depending on the dimensions of the cover element. The side slots are in this case preferably incorporated in the area of the cover on which the at least one hooking-in element is located, and which is hooked into the base body before being latched in in the course of the locking process. However, it is also feasible for the side slots to be incorporated on the cover element in the area of the at least one latching tab.

In a further embodiment, a hole whose diameter is larger than the slot width is provided at that end of each side slot which is remote from the outer edge of the cover element. This variant offers the advantage that the degree of mobility of the elastically flexible areas of the cover element can be defined as a function of the radius of the holes which are incorporated at the end of the side slots, without having to enlarge or modify the slot width. This procedure is particularly advantageous when it is desirable for the cover to be particularly robust and for the cover element to have relatively thick walls.

In a further advantageous embodiment, at least a portion of the area covered by the cover element can be sealed by means of a seal which is introduced between the cover element and the base body. This results in the cover and the object covered by it being protected against dust, dirt, moisture or other external influences so that it can also be used, for example in an industrial environment or in the open air, without the functionality being restricted.

In a further advantageous embodiment, a rim is provided on the cover element and/or on the base body which is in the form of a holder, which rim is opposite a rim on the base body or on the cover element when in the locked state, and to which the at least one latching tab is fitted, and at least one cutout is provided for unlocking the lock between the cover element and the base body. In this case, the cutout is preferably used to allow a tool, for example a screwdriver, to be fitted simply and without damaging the surfaces or edges of the cover when the cover is in the locked state. This means that the connection between the cover element and the base body can be unlatched, and that the cover element can thus be unlocked from its lock particularly easily owing to the lever effect which can be exerted by means of the tool to release the at least one latching tab from its engagement with the latching opening that corresponds to it.

In a further advantageous embodiment, a force can be exerted on the base body by means of the cover element via a contact tab which is in the form of a stop on the base body and is provided in the area of the cutout which is in the form of a hooking-in opening, in which case, the base body can be at least partially resiliently deformed, thus making it possible to produce a spring force which acts on the cover element via the contact tab. The contact tab which is formed on the base body in this case makes it possible to create a force application point on the base body for movement of the cover element from its latched connection to the base body, thus allowing a bending moment to be exerted in a controlled manner on the elastically deformable area of the base body. This makes it particularly simple and convenient for the user to release the lock between the cover element and the base body.

In a further advantageous embodiment, the cover element is elongated and can be moved in the longitudinal direction in the state in which it is locked to the base body, in order to unlock the lock. In this case, the cover element preferably has a profiled tab, which runs in the transverse direction, on its surface which faces away from the base body and which is preferably domed but can also be flat. This profiled tab allows movement in the longitudinal direction without the use of additional tools, thus making it particularly easy to release the latching connection between the cover element and the base body.

In a further advantageous embodiment, when it is in the unlatched state, the cover element has a bend along its longitudinal direction about a transverse axis which runs parallel to its flat surface. In contrast, in the latched-in state, the cover element is straightened against the curvature direction of its bend by elastic deformation, and is thus prestressed to a certain extent. This leads on the one hand to a label located under the cover being pressed against the body, and being fixed there, by the prestressed cover element, which serves in particular to prevent bends and ripples in the label material, and to prevent the label from sliding. On the other hand, the prestressing means that, during unlocking of the lock between the cover element and the base body, the cover element then tries to relax its prestress and to resume its originally curved position. Thus, once the latching connection has been released, the unlatched cover element then automatically bends away from the base body, and can thus be removed more easily from the depression, which is in the form of a holding trough, in the base body.

In one preferred embodiment, when it is in the unlatched state, the cover element is curved such that at least one outer end of the cover element, which is located in the longitudinal direction, is spread out in a direction which runs away from the base body. In this case, preferably throughout the lateral movement of the cover element which is required to unlock the connection, the hooking-in element at its other end remains engaged with the cutout which corresponds to it and is in the form of a hooking-in opening. The cover element can thus be detached from the base body, and removed from the holder, particularly easily and conveniently.

BRIEF DESCRIPTION OF THE DRAWINGS

The invention will be explained in more detail with reference to one preferred exemplary embodiment. In the associated drawings.

DETAILED DESCRIPTION

Figure 1:
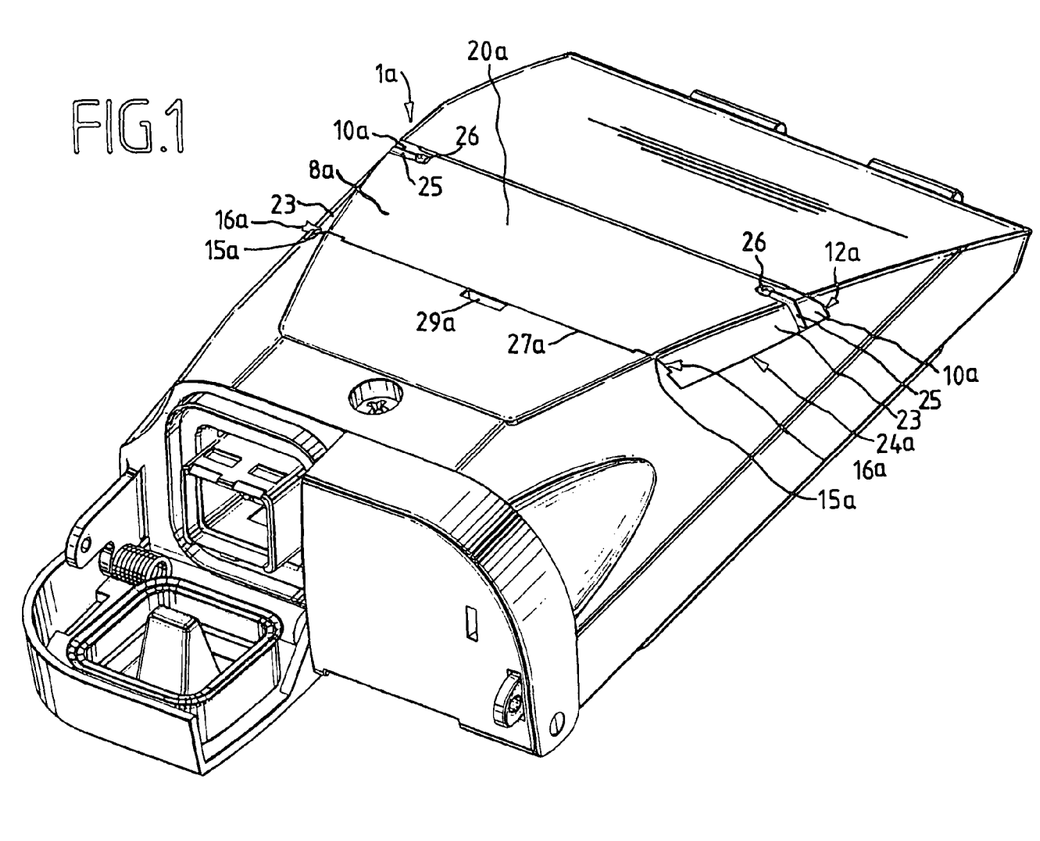
FIG. 1 shows a perspective illustration in the form of an oblique view of one preferred embodiment of a cover according to the invention.

FIG. 1 shows a perspective illustration of the oblique view of a connecting socket provided with a cover for an inscription field. A cover element 8a is shown in this case, which is intended for insertion in a base body 1a which is in the form of a holder. In the illustration, the cover element 8a is in the state which is latched in the base body 1a. The cover element 8a is formed from transparent plastic. Two hooking-in elements 10a are provided on the cover element 8a, are partially in the form of wedges, and can each engage with one of two appropriately corresponding cutouts, which are likewise partially in the form of wedges as hooking-in openings 12a, on the base body 1a. In the area of the two hooking-in elements 10a, the cover element 8a has side slots 25 which originate from the outer rim, which bounds the side surfaces 23, of the cover element 8a, so that the area of the cover 8a on which the two hooking-in elements 10a are located can move elastically and flexibly transversely with respect to the slot direction.

The side slots 25 are in this case incorporated in the area of the cover 8*a* on which the two hooking-in elements 10*a* are located, and which is hooked into the base body 1*a* before being latched in the course of the locking process. A hole 26 whose diameter is greater than the width of the slots 25 is provided at that end of each side slot 25 which is remote from the outer edge or the side surface 23 of the cover element 8*a*. In addition, two latching tabs 15*a* are provided on the base body 1*a* and can be engaged with two cutouts which correspond to the latching tabs 15*a*, are provided on the cover element 8*a* and are in the form of latching openings 16*a*, thus forming a detachable latching connection between the cover element 8*a* and the base body 1*a*. In this case, the cover element 8*a* is partially elastically deformable in the area of the two hooking-in elements 10*a* in a direction which runs parallel to the surface 20*a*, so that the cover element 8*a* and the base body 1*a* can be locked into one another such that they latch in in a sprung manner. The surface 20*a* is in this case that outer surface of the cover element 8*a* which faces away from the base body 1*a* in the latched-in state. In the course of the locking process, the cover element 8*a* can be embedded flush in the base body 1*a*, which has a depression 24*a* and is in the form of a holder. In this case, the depression 24*a* which is provided as a holder in the base body 1*a* is in the form of a trough whose dimensions and shape correspond to the cover element 8*a*, and in which the cover element 8*a* can be embedded. After being latched in, the surface 20*a* of the cover element 8*a* then ends flush with the surrounding flat outer surface of the base body 1*a*. The two side surfaces 23 of the cover element 8*a* are slightly inclined and curved with respect to the surface 20*a*, so that their dimensions and shape correspond to the external shape of the base body 1*a* at the point which is provided for the cover element 8*a* and, after the cover element 8*a* has been latched in, likewise end flush with the outer surface of the cover element 8*a*. A seal, which is not illustrated in FIG. 1, is incorporated between the cover element 8*a* and the base body 1*a*, and is used to seal a part of the area of the base body 1*a* that is covered by the cover element 8*a* from the cover element 8*a*. Furthermore, a rim 27*a* is provided on the base body 1*a*, bounds the depression 24*a* on one side and, in the locked state, is opposite a rim on the cover element 8*a*, and to which the two latching tabs 15*a* are fitted and on which a cutout 29 *a* is provided for unlocking the lock between the cover element 8*a* and the base body 1*a*. In this case, the cutout 29*a* is to used to allow a tool, for example a screwdriver, to be fitted when the cover is in the locked state. The two latching tabs 15*a* can thus then be disengaged from the latching openings 16*a* which correspond to them as a result of the lever effect which can be exerted by means of the tool, the connection between the cover element 8*a* and the base body 1*a* can be unlatched, and the cover element 8*a* can thus be unlocked from its lock. When the latching connection between the base body 1*a* and the cover element 8*a* is released, the cover element 8*a* can then be tilted about the two hooking-in elements 10*a* in the direction facing away from the base body 1*a*, and can be removed from the depression 24*a* in the base body 1*a*.

Figure 2:
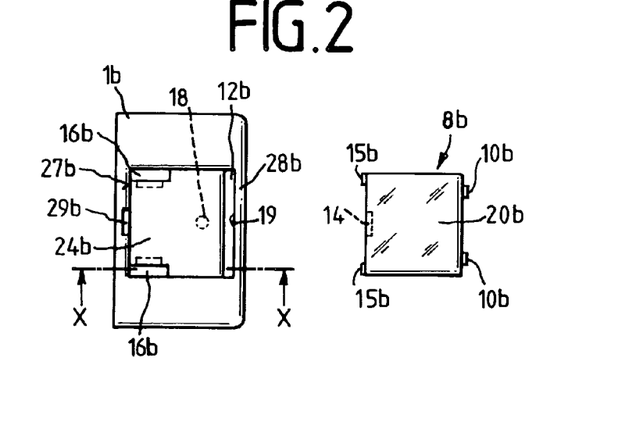
FIG. 2 shows a plan view of a further preferred embodiment of a cover according to the invention, FIG. 3a each show cross-section views of the same and Figure embodiment, 3b.

FIG. 2 shows the plan view of one alternative embodiment of a cover according to the invention for an inscription field. A cover element 8*b* is shown in this case which is intended for insertion in a base body 1*b* in the form of a holder. In this alternative embodiment, the base body 1*b* is, furthermore, itself in the form of a plug-in element of a front panel, and is intended for fitting to a metal frame, which is not illustrated in the figures but is in the form of a mount element. In the illustration, the cover element 8*b* and the base body 1*b* are in the unlatched state, and are not locked to one another. In the course of the locking process, the cover element 8*b* can be embedded flush in the base body 1*b*, which has a depression 24*b* and is in the form of a holder (see FIG. 3*a*). In this case, a trough whose dimensions and shape correspond to the cover element 8*b* is formed as a holder in the base body 1*b*, and the cover element 8*b* can be embedded in it. After being latched in, the surface 20*b* of the cover element 8*b* then ends flush with the surrounding flat surface of the base body 1*b* (see FIG. 3*b*). The surface 20*b* is in this case that outer surface of the cover element 8*b* which faces away from the base body 1*b* in the latched-in state. It has an essentially square shape. The cover element 8*b* is formed from transparent plastic. Two hooking-in elements 10*b* are provided on the cover element 8*b* and can be engaged with a cutout, which is in the form of a hooking-in opening 12*b*, on the base body 1*b*. The hooking-in opening 12*b* is in this case in the form of an elongated slot on the base body 1*b*, which is used to hold both hooking-in elements 10*b* on the cover element 8*b*, with the slot on the one hand interrupting the direct connection between an end wall 28*b*, which is immediately adjacent to the hooking-in opening 12*b*, of the base body 1*b* and the base of the depression 24*b* in the base body 1*b*, so that the end wall 28*b* can move flexibly independently of the base of the depression 24*b*, and, on the other hand, with an undercut being formed underneath the surface of the base body 1*b*, in which the hooking-in elements 10*b* on the cover element 8*b* can engage. Furthermore, two latching tabs 15*b* are provided on the cover element 8*b* and can be engaged with in each case one of two cutouts, which correspond to the latching tabs 15*b*, are provided on the base body 1*b* and are in the form of a latching opening 16*b*. This makes it possible to form a detachable latching connection between the cover element 8*b* and the base body 1*b*, with the base body 1*b* being partially elastically deformable in the area of the hooking-in opening 12*b* in a direction which runs parallel to the surface 20*b*, so that the cover element 8*b* and the base body 1*b* can be locked to one another such that they latch in a sprung manner. Furthermore, a rim 27*b* is provided on the base body 1*b*, bounds the depression 24*b* on one side and is opposite a rim on the cover element 8*b* in the locked state, and on which a cutout 29*b* is provided for unlocking the lock between the cover element 8*b* and the base body 1*b*. In this case, the cutout 29*b* is used to allow a tool, for example a screwdriver, to be fitted when the cover is in the locked state. This procedure is additionally made even simpler by a slightly inclined cutout 14 which is provided on the cover element 8*b* and is opposite the cutout 29*b* in the base body 1*b* in the locked state. A contact tab 19, which is in the form of a stop and projects transversely into the area of the elongated, slotted hooking-in opening 12*b*, is additionally formed on the inside of the end wall 28*b* of the base body 1*b*. This allows a force to be exerted, by means of the cover element 8*b*, on the end wall 28*b* of the base body 1*b*, with the base body 1*b* being partially resilientlyde formable there, thus making it possible to produce a spring force which acts on the cover element 8*b* via the contact tab 19. The slightly rounded shape of the contact tab 19 means that, during the movement of the cover element 8*b* from its latched connection to the base body 1*b*, the force which is exerted by the cover element 8*b* acts at a point on the base body 1*b*. A bending moment is thus exerted in a controlled manner on the elastically deformable area of the base body 1*b*, and its end wall 28*b*. In this way, the two latching tabs 15*b* can be disengaged from the latching openings 16*b* which correspond to them as a result of the lever effect which can be exerted on the cover element 8*b* by means of the tool which can be fitted to the cutout 29*b*, the connection between the cover element 8*b* and the base body 1*b* can be unlatched, and the cover element 8*b* can thus be unlocked from its lock. When the latching connection between the base body 1b and the cover element 8b is released, the cover element 8b can be tilted about the two-hooking in elements 10b in the direction facing away from the base body 1b, and can be removed from the depression 24b in the base body 1b.

Figure 3A:
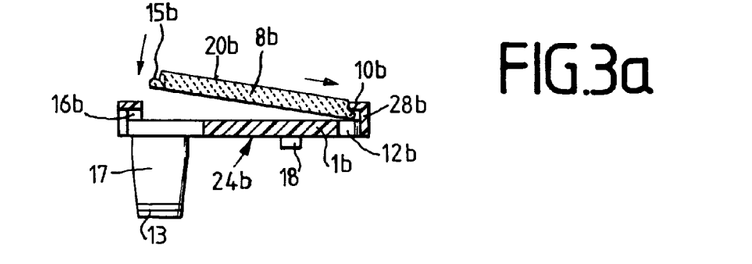
Figure 3B:
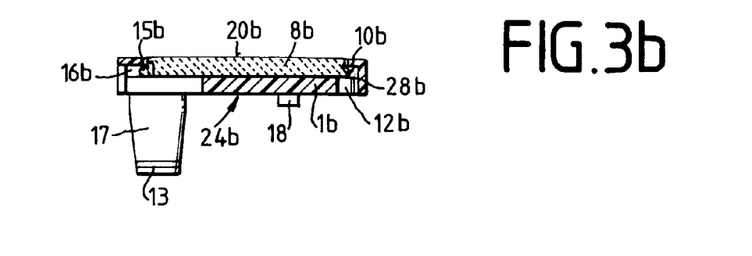

FIG. 3a and FIG. 3b each show a cross-section view of the same embodiment of a cover for an inscription field as shown in FIG. 2. The section is in this case along the line X-X shown between the two arrows in FIG. 2. In the illustration shown in FIG. 3a, the cover element 8b and the base body 1b are in a state in which the cover element 8b is just being inserted in the base body 1b and the two are being locked to one another. In the illustration shown in FIG. 3b, the cover element 8b and the base body 1b are already in the latched-in state and are locked to one another. In this case, and in contrast to FIG. 2, FIG. 3a and FIG. 3b each show that the cover element 8b is embedded flush in the base body 1b, which has the depression 24b and is in the form of a holder, in the course of the locking process, and, after latching in, that surface 20b of the cover element 8b which faces away from the base body 1b ends flush with the surrounding flat surface of the base body 1b. The illustration also shows how at least one of the two hooking-in elements 10b which are provided on the cover element 8b engages with the hooking-in opening 12b in the base body 1b, with the hooking-in opening 12b being in the form of an elongated slot in the base body 1b, which is used to hold the two hooking-in elements 10b on the cover element 8b. In this case, the illustration in particular also shows that the slot which forms the hooking-in opening 12b on the one hand interrupts the direct connection between the end wall 28b of the base body 1 which is immediately adjacent to the hooking-in opening 12b and the base of the depression 24b in the base body 1b, so that the end wall 28b can move flexibly independently of the base of the depression 24b, and that the slot which forms the hooking-in opening 12b on the other hand forms an undercut underneath the surface of the base body 1b, in which the hooking-in elements 10b on the cover element engage. Furthermore, at least one of the two latching tabs 15b which are provided on the cover element 8b is illustrated, which engages with one of the two latching openings 16b which correspond to the latching tabs 15b and are provided on the base body 1b. In this case, the latching openings 16b also form an undercut underneath the surface of the base body 1b, in which the latching tabs 15b on the cover element 8b engage. Since, in this alternative embodiment, the base body 1b itself is furthermore in the form of a plug-in element of a front panel and is intended to be fitted to a metal frame, which is not illustrated in the figures but is in the form of a mount element, the base body 1b for this purpose has two attachment lugs 17 and a centering tab 18. These are intended to engage with openings which are located on the metal frame and in each case correspond to them, and are used for positioning, for fixing and to provide strength for the base body 1b on the metal frame. The attachment lugs 17 in this case each have a latching web 13 at their outer end, by means of which the base body 1b can be attached such that it latches into the openings provided for this purpose in the metal frame.

Figure 4:
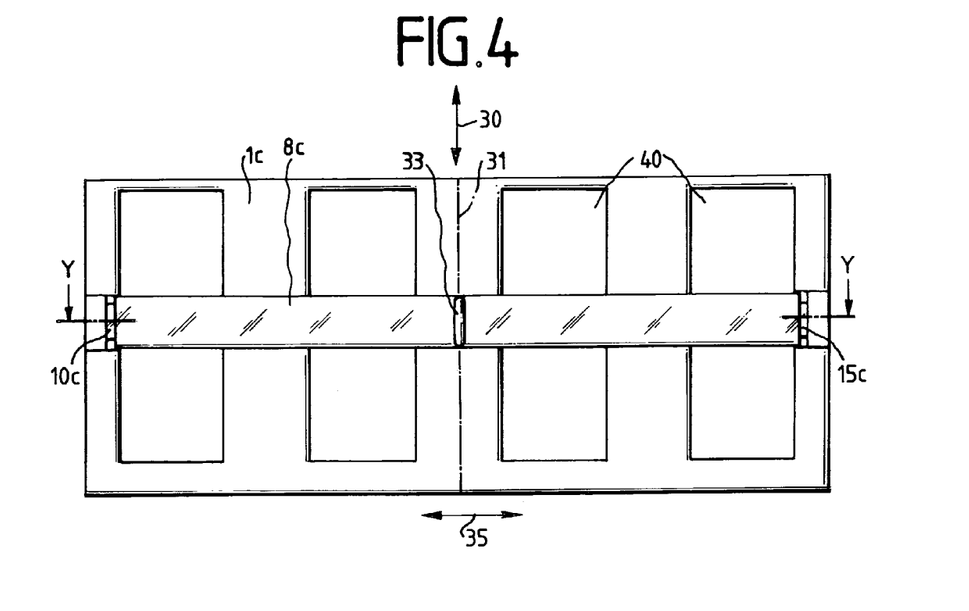
FIG. 4 shows a plan view of a further preferred embodiment of a cover according to the invention.

FIG. 4 shows the plan view of a further preferred embodiment of a cover according to the invention for an inscription field. In this case, a cover element 8c is illustrated which is intended for insertion into a base body 1c in the form of a holder. The base body 1c is in this case in the form of a front panel and has a number of openings 40 which allow access to connections for data lines with which the panel, for example, can be fitted. In the illustration, the cover element 8c is in the state in which it is latched in the base body 1c. The cover element 8c is formed from transparent plastic. A hooking-in element 10c is provided on the cover element 8c and engages with a cutout on the base body 1c, which is in the form of a hooking-in opening 12c (see FIG. 6a and FIG. 6b). Furthermore, a latching tab 15c is provided on the cover element 8c and engages with a cutout which corresponds to the latching tab 15c, is provided on the base body 1c and is in the form of a latching opening 16c (see FIG. 6a and FIG. 6b), thus forming a detachable latching connection between the cover element 8c and the base body 1c. The width of the hooking-in element 10c measured in the transverse direction 30 and that of the latching tab 15c are in this case each only slightly narrower than the width of the cover element 8c itself. In this case, the base body 1c is partially elastically deformable in the area of the hooking-in opening 12c in a direction which runs parallel to the surface 20c, so that the cover element 8c and the base body 1c can be locked to one another such that they latch in in a sprung manner. The surface 20c is in this case that outer surface of the cover element 8c which faces away from the base body 1c in the latched-in state. The cover element 8c is designed to be symmetrical with respect to its central transverse axis 31. In this case, the hooking-in element 10c and the latching tab 15c have the same shape and the same dimensions, so that the cover element 8c can also be rotated through 180° about the central axis at right angles to the surface 20c, and can nevertheless still be locked to the base body 1c in the same way. In this case, the original hooking-in element 10c can then act as a latching tab, and the original latching tab 15c can act as a hooking-in element. In the latched-in state, the cover element 8c is embedded flush in the base body 1c, which is in the form of a holder and has a depression 24c (see FIG. 5). In this case, a trough whose dimensions and shape correspond to the cover element 8c is provided as a holder in the base body 1c, in which the cover element 8c can be embedded in the course of the locking process. After latching in, the surface 20c of the cover element 8c then ends flush with the surrounding flat surface of the base body 1c, and essentially matches its surface contour. The cover element 8c is elongated and, in the state in which it is locked to the base body 1c, can be moved in the longitudinal direction 35 for the purpose of unlocking the lock. The cover element 8c in this case has (on its surface 20c which is domed) a profiled tab 33 which runs in the transverse direction 30 and allows movement in the longitudinal direction 35 without the use of additional tools, thus making it possible to detach the latching connection between the cover element 8c and the base body 1c. In the unlatched state (see FIG. 5), the cover element 8c is bent along its longitudinal direction 35 about the transverse axis 31, which runs parallel to its surface 20c. In contrast, in the latched-in state, the cover element 8c is straightened by means of elastic deformation against the curvature direction of its bend, and is thus prestressed to a certain extent. This leads to a label (not illustrated) which is located under the cover 8c being pressed against the base body 1c by the prestressed cover element 8c, and being fixed there. On the other hand, the prestress leads to the cover element 8c trying to relax its prestress and resume its originally curved position during the unlocking of the lock between the cover element 8c and the base body 1c. Thus, once the latching connection has been released, the unlatched cover element 8c then automatically bends away from the base body 1c. In the unlatched state, the cover element 8c is then curved such that the outer end 36 of the cover element 8c in the longitudinal direction 35 is spread out in a direction which runs away from the base body 1c. In this case, throughout the lateral movement of the cover element 8c which is required to unlock the connection, its other end remains engaged by means of its hooking-in element 10c, with the hooking-in opening 12c which corresponds to it. The cover element 8c can then be tilted about the hooking-in element 10c, and can thus easily be removed from the depression 24c in the base body 1c.

Figure 5:
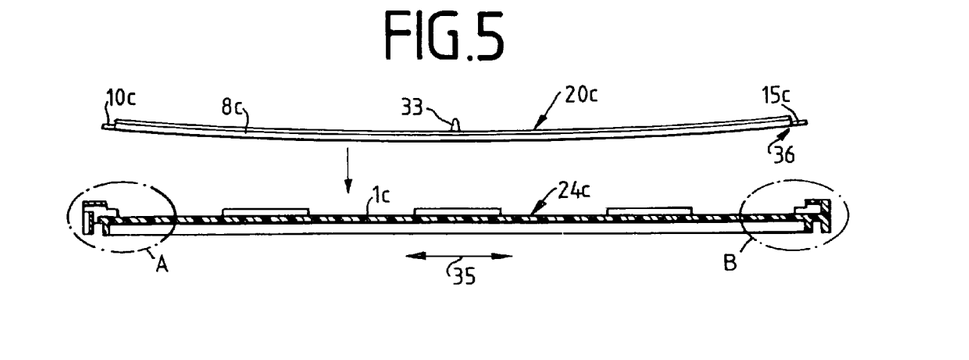
FIG. 5 shows a cross-section view of the same embodiment, FIG. 6a and FIG. 6a show cross-sectional views of the same embodiment shown in FIGS. 4 and 5.

FIG. 5 shows a cross-section view of the same embodiment of a cover for an inscription field as that shown in FIG. 4. The section is in this case along the line Y-Y shown between the two arrows in FIG. 4. In the illustration shown in FIG. 5, the cover element 8c and the base body 1c are in the unlatched state and are not locked to one another. The hooking-in element 10c is provided on the cover element 8c and can be engaged with the cutout, which is in the form of a hooking-in opening 12c (see FIG. 6a and FIG. 6b), in the base body 1c. Furthermore, the latching tab 15c is provided on the cover element 8c, and the profiled tab 33 can be seen.

Figure 6A:
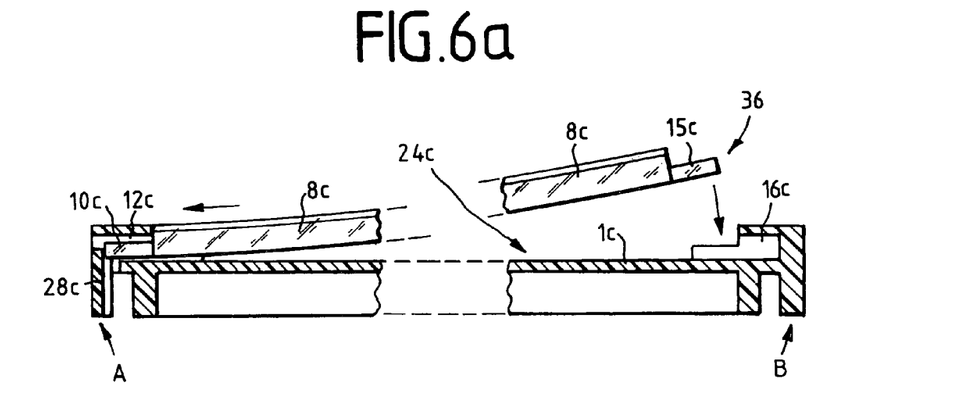
Figure 6B:
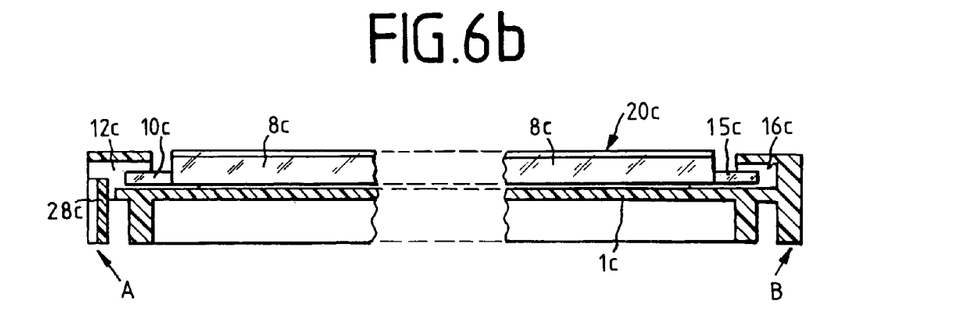

FIG. 6a and FIG. 6b show a detailed illustration of the cross-section view of the same embodiment of a cover for an inscription field as that shown in FIG. 4 and FIG. 5. In this case, those end areas of the base body 1c which are identified by A and B in FIG. 5 are illustrated enlarged in FIG. 6a and FIG. 6b. In this case, the illustration shows, in particular, the hooking-in opening 12c with which the hooking-in element 10c that is provided on the cover element 8c can engage. The latching opening 16c is also shown, which corresponds to the latching tab 15c provided on the cover element 8c, and with which the latching tab 15c can engage, thus making it possible to form a detachable latching connection between the cover element 8c and the base body 1c. The latching opening 16c is in this case in the form of an elongated slot in the base body 1c, which is used to hold the latching tab 15c on the cover element 8c, with an undercut being formed underneath the surface of the base body 1c, in which the latching tab 15c on the cover element 8c can engage. The hooking-in opening 12c is likewise in the form of an elongated slot in the base body 1c, which is used to hold the hooking-in element 10c, with the slot on the one hand interrupting the direct connection between an end wall 28c of the base body 1c, which is immediately adjacent to the hooking-in opening 12c, and the base of the depression 24c in the base body 1c, so that the end wall 28c can move flexibly independently of the base of the depression 24c, and on the other hand forming an undercut underneath the surface of the base body 1c, in which the hooking-in element 10c on the cover element 8c can engage. Furthermore, a contact tab which is in the form of a stop but is not illustrated in the drawing and projects into the area of the elongated, slotted hooking-in opening 12c is formed on the inside of the end wall 28c of the base body 1c. This contact tab, which is in the form of a stop on the base body 1c, is provided as the end section of the end wall 28c, and is in the form of a resiliently flexible lug. The resiliently flexible lug is in this case firmly connected to the base body 1c only at one of its ends, and can otherwise be resiliently deflected in the longitudinal direction 35 with respect to the base body 1c. The contact tab allows the hooking-in element 10c to exert a force on the end wall 28c of the base body 1c, which is the form of a lug, with the base body 1c being partially resiliently flexibly deformable there, thus making it possible to produce a spring force which acts on the cover element 8c via the contact tab. During movement of the cover element 8c from its latched connection to the base body 1c, the contact tab which is formed on the inside of the end wall 28c of the base body 1c results in the force which is exerted by the hooking-in element 10c acting at a point on the end wall 28c (which is in the form of a resiliently flexible lug) of the base body 1c. A bending moment is thus exerted in a controlled manner on the elastically deformable area of the base body 1c and its end wall 28c. This makes it possible to release the lock between to release the lock between the cover element 8c and the base body 1c. The movement of the cover element 8c in the longitudinal direction 35 then results in the latching tab 15c being disengaged from the latching opening 16c, thus unlocking the lock between the cover element 8c and the base body 1c.

Figure 7:
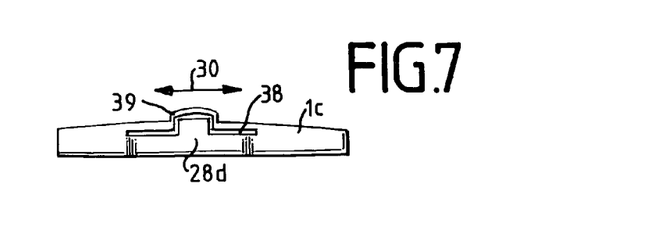
FIG. 7 shows a side view of one variant of the same embodiment.

FIG. 7 shows a side view of a further embodiment of a cover for an inscription field, which is very similar to that illustrated in FIG. 4 to FIG. 6b and shows a variant of this. The figure in this case shows only the base body 1c in the unlatched state, with the base body 1c and the cover element 8c not being locked to one another. The base body 1c is in this case fundamentally designed in precisely the same way as the base body shown in FIG. 4 to FIG. 6b. However, the end wall 28d of the base body 1c is in this case not in the form of a resiliently flexible lug. In fact, the end wall 28d of the base body 1c has a slot 38 which runs at least partially in the transverse direction 30 and is otherwise connected firmly to the base body 1c at two of its sides. However, this means that it can also be deflected resiliently in the longitudinal direction 35 with respect to the base body 1c, so that the mechanism for unlatching the connection between the cover element 8c and the base body 1c can be carried out in precisely the same way as that described above. The figure also shows that the surface of the base body 1c has a dome 39 which runs in the transverse direction 30, with which that surface 20c, which faces away from the base body 1c, of the cover element 8c, which is likewise domed, then ends flush in the latched-in state.

Figure 8:
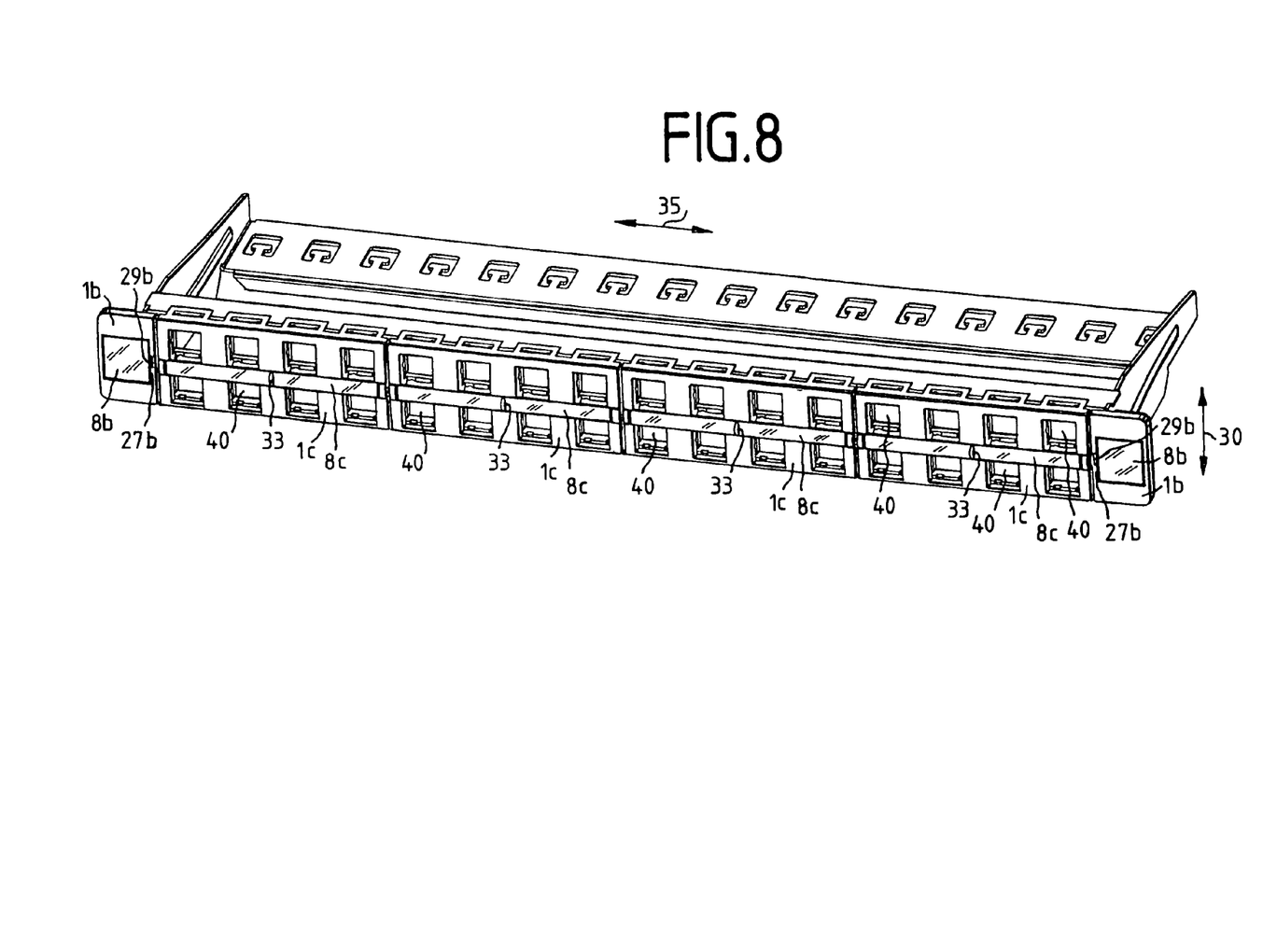
FIG. 8 shows a perspective illustration of a front panel which contains two different embodiments of the invention.

FIG. 8 shows a perspective illustration of a front panel which includes two exemplary embodiments two examples of the use of different embodiments of the invention. On the one hand, one variant of the embodiment which is shown in FIG. 2, FIG. 3a and FIG. 3b is in each case illustrated as an example of use at the left-hand and right-hand end of the connecting strip. In this case, the transparent cover element 8b and the base body 1b are in the latched-in state, and are locked to one another. FIG. 8 also shows that a rim 27b is provided on the base body 1b and is opposite the rim of the cover element 8b in the locked state, and on which a cutout 29b is provided for unlocking the lock between the cover element 8b and the base body 1b. This cutout 29b is preferably used to allow a tool, for example a screwdriver, to be fitted when the cover is in the locked state, so that the connection between the cover element 8b and the base body 1b can be unlatched as a result of the lever effect which can be exerted by means of the tool, with the cover element 8b being unlocked from its lock. On the other hand, FIG. 8 shows a fourth version of the embodiment described in FIG. 4 to FIG. 7, as an example of use. This is in each case a transparent cover element 8c which is in the latched-in state with in each case one base body 1c, with the cover element 8c and the base body 1c in each case being locked to one another. The base body 1c in each case has a number of openings 40, which allow access to connections for data lines with which, for example, the panel may be fitted. The cover element 8c is elongated, and, in the state in which it is locked to the base body 1c, can be moved in the longitudinal direction 35 in order to unlock the lock. In this case, on its surface 20c facing away from the base body 1c, each of the cover elements 8c has a profiled tab 33 which runs in the transverse direction 30 and allows movement in the longitudinal direction 35 without the use of additional tools, thus making it possible to release the latching connection between the cover element 8c and the base body 1c. Otherwise, this example of use also has the features described in FIG. 4 to FIG. 6b (and FIG. 7).

LIST OF REFERENCE SYMBOLS 1a, 1b, 1c Base body
8a, 8b, 8c Cover element 10a, 10b, 10c Hooking-in element
12a, 12b, 12c Hooking-in opening
13 Latching web
14 Cutout
15a, 15b, 15c Latching tab
16a, 16b, 16c Latching opening
17 Attachment lug
18 Centering tab
19 Contact tab
20a, 20b, 20c Surface
23 Side surface
24a, 24b, 24c Depression
25 Side slot
26 Hole
27a, 27b Rim of the base body
28b, 28c, 28d End wall of the base body
29a, 29b Cutout
30 Transverse direction
31 Transverse axis
33 Profiled tab
35 Longitudinal direction
36 Outer end
38 Slot
39 Dome
40 Opening

The invention claimed is:

1. A cover for covering inscription fields, comprising a cover element, which is provided for insertion into a base body, the cover element including at least one hooking-in element, which is configured to be engaged with at least one cutout defined by the base body, and the cover element defining at least one latching cutout that is configured to accommodate at least one latching tab being provided on the base body, thus forming a detachable latching connection between the cover element and the base body,
wherein the at least one hooking-in element is at least partially elastically deformable in a direction running parallel to a surface of the cover element so that the cover element and the base body can be locked to one another by latching in a sprung manner;
wherein the cover element has a periphery defined by a first set of outer edges extending between a second set of outer edges, the cover element defining side slots, which originate from the first set of outer edge, in an area of the at least one hooking-in element, the side slots extending in a direction generally parallel to the second set of outer edges, so that the hooking-in element is configured to be moved elastically and flexibly transversely with respect to the direction of the slots; and
wherein a hole whose diameter is larger than the slot width is provided at that end of each side slot which is remote from the respective outer edge of the first set.

2. The cover as claimed in claim 1, wherein the cover element is formed from transparent material.

3. The cover as claimed in claim 1, wherein the cover element can be embedded flush in a base body which has a depression and is in the form of a holder.

4. The cover as claimed in claim 1, wherein the cover element is configured to be tilted about the hooking-in element after the latching connection has been released, and is configured to be removed from the base body.

5. The cover as claimed in claim 1, wherein the at least one hooking-in element is at least partially wedge-shaped and wherein the cutout on the base body at least partially defines a wedge shape.

6. The cover as claimed in claim 1, wherein at least a portion of an area covered by the cover element can be sealed by means of a seal which is introduced between the cover element and the base body.

7. The cover as claimed in claim 1, wherein the cover element includes a rim, which is positioned opposite a rim on the base body when the cover element is arranged in a locked state relative to the base body, and wherein the at least one latching tab engages the rim of the cover element when the latching tab is fitted within the latching cutout of the cover element, and wherein the base body defines a second cutout for unlocking the cover element and the base body.

* * * * *